United States Patent [19]
Kobayashi

[11] Patent Number: 5,781,493
[45] Date of Patent: Jul. 14, 1998

[54] SEMICONDUCTOR MEMORY DEVICE HAVING BLOCK WRITE FUNCTION

[75] Inventor: Shotaro Kobayashi, Tokyo, Japan

[73] Assignee: NEC Corporation, Tokyo, Japan

[21] Appl. No.: 754,368

[22] Filed: Nov. 22, 1996

[30] Foreign Application Priority Data

Nov. 24, 1995 [JP] Japan ..................... 7-329961

[51] Int. Cl.[6] ..................................... G11C 7/00
[52] U.S. Cl. ................... 365/230.03; 365/230.06
[58] Field of Search .............. 365/230.03, 230.06, 365/190, 238.5

[56] References Cited

U.S. PATENT DOCUMENTS 5,365,489  11/1994  Jeong ...................... 365/230.06
5,497,352  3/1996   Magome ................... 365/230.06

FOREIGN PATENT DOCUMENTS 4-325991  11/1992  Japan.

Primary Examiner—Vu A. Le
Attorney, Agent, or Firm—Foley & Lardner

[57] ABSTRACT

A semiconductor memory device is provided with a first data line pair, second data line pair, a plurality of first bit line pairs respectively connected to the first data line pair through a plurality of first transfer gates, a plurality of second bit line pairs respectively connected to the second data line pair through a plurality of second transfer gates, a plurality of column select lines respectively connected commonly to one first transfer gate and one second transfer gate. A decoder circuit is supplied with an input address and block write signal for activating simultaneously at least two column select lines regardless of the input address while the block write signal is activated, and for activating the column select line corresponding to the input address while the block write signal is inactivated.

4 Claims, 4 Drawing Sheets

SEMICONDUCTOR MEMORY DEVICE HAVING BLOCK WRITE FUNCTION

BACKGROUND OF THE INVENTION

1. Field of the Invention

This invention relates to a semiconductor memory device, and particularly relates to a semiconductor memory device having a block write function.

2. Description of the Prior Art

It is essential to provide a block write function for so-called video RAM (VRAM) and synchronous graphic RAM used as memory devices of the image. The block writing function is described hereinbelow.

In the usual writing operation, only one address is written, on the other hand, in the block write operation, the same data is simultaneously written to a plurality of memory address. When this occurs prescribed low order bits of an address signal are generally ignored, and the writing is performed. In detail, for example, two bits from the lowest order bits (LSB) signal of an address are ignored to write to four columns, and three bits from the lowest order bits signal are ignored to write to eight columns. Thereby, the block write function is advantageous in that the writing is performed by one cycle instead of the usual four or eight cycles.

FIG. 1 and FIG. 2 shows the structure of a DRAM having a block write function disclosed in Japanese Patent Laid-open No. Hei 4-325991. The block write function will be described referring to FIG. 1 hereinbelow. The figure shows a structure in which data are simultaneously written on four bits for a block write operation. Four pairs of bit lines BL1-*BL1 (* referred to as an inverse signal), BL2-*BL2, BL3-*BL3, and BL4-*BL4 form a group and each bit line pair is connected to data bus pairs DB1-*DB1 to DB4-*DB4. Though not shown in the figure, the group is connected to a plurality of data buses.

A column select signal CL generated from a column decoder 2 makes a column select transistor Tr1 conductive, and the four bit line pairs are simultaneously connected electrically to the data bus pairs. The memory cells C connected to the selected word line WL are written or read.

Write amplifiers $3_1$ to $3_4$ are connected to the data bus pairs DB1-*DB1 to DB4-*DB4 respectively. The write amplifiers $3_1$ to $3_4$ are operated based on a write control signal outputted from a write amplifier controller 4.

A block write signal BW is inputted from a controller (not shown in the figure) to the write amplifier controller 4 for the performing a block write. Upon inputting of the block write control signal BW, the write amplifier controller 4 outputs write signals simultaneously to write amplifiers $3_1$ to $3_4$ and the four write amplifiers are simultaneously operated.

For a read operation, a sense buffer 6 is connected to the data bus pairs DB1-*DB1 to DB4-*DB4 through a selector 5 for selecting any one data bus pair out of the data bus pairs DB1-*DB1 to DB4 to *DB4. The cell information read on the selected data bus is amplified and output to the subsequent circuit (not shown in the figure).

A reset signal RS is set at Low level when a write operation signal is inputted to the gate of each N channel MOS transistor Tr2. Upon turning each N channel MOS transistor Tr2 on based on a High level of reset signal RS, the potential of the data bus pairs DB1-*DB1 to DB4-*DB4 is set to the potential of approximately the power source Vcc.

Operation of the DRAM shown in FIG. 1 is now described. Any one of the word lines WL is selected, the reset signal RS is made Low level to enable a block write operation, and the transistors Tr2 are turned off. In this condition, the select signal CL from the column decoder 2 turns the column select gates Tr1 on to select the bit lines BL1-*BL1 to BL4-*BL4. The write amplifiers $3_1$ to $3_4$ are simultaneously operated based on the output signal of the write amplifier controller 4 to write data on the four memory cells C selected by the word line WL through the data buses DB1-*DB1 to DB4-*DB4 and the bit lines BL1-*BL1 to BL4-*BL4.

For a normal write operation, any one of the word lines is selected, the reset signal RS is made Low level, and the transistors Tr2 are turned off. In this condition, the column select gates Tr1 are turned on by the column decoder 2 and the bit lines BL1-*BL1 to BL4-*BL4 are selected. Any one of the write amplifiers $3_1$ to $3_4$ is operated to write data on any one memory cell C out of the four memory cells C selected by the word line WL.

On the other hand, for a read operation, the reset signal RS is made High level, the transistors Tr2 are turned on, and the data buses DB1-*DB1 to DB4-*DB4 are set to a potential approximate to the level of power source potential Vcc. Upon the word line WL being selected and the column select gates Tr1 being turned on by the column decoder 2 to select the bit lines BL1-*BL1 to BL4-*BL4, information is read respectively from the memory cells C selected by the word line WL to generate the potential difference between the data bus pairs DB1-*DB1 to DB4-*DB4.

Any one data bus pair is selected out of the data bus pairs DB1-*DB1 to DB4-*DB4 by the selector 5 and the cell information read on the data bus is outputted through the sense buffer 6.

Because the number of addresses to be written simultaneously is four in FIG. 1, the number of columns of block write is four, that is, four pairs of data buses are required. For eight columns, the number of data buses is required to increase to eight pairs.

For memory of the 2M- to 4M-bit class, there are eight to sixteen I/O terminals, and there are therefore eight to sixteen data bus locations. The number of data buses increases by 64 lines to 128 lines or more to and therefore occupies a significant area. Because it is required to select the number of columns corresponding to the block write with a single column select signal, for substituting a single column select line during redundancy, it is required to prepare four columns for the block write of four columns, and eight columns for the block write of eight columns as the column for redundancy. For further increase of the number of columns, the number of redundant columns required for the same number of redundancy increases to result in increased chip size and the difficulty in increase of the number of column redundancy.

Next, a conventional example is described referring to FIG. 2. In the figure, column decoders 7 are provided for selecting independently the bit line pairs BL1-*BL1 to BL4-*BL4. Operation of the column decoders 7 is controlled by a pre-decoder 8, and the pre-decoder 8 receives an address select signal from an address buffer 9.

For block write operation, the pre-decoder 8 receives a block write signal BW, and the pre-decoder 8 operates simultaneously the column decoders 7 based on the block write signal BW to select simultaneously the bit lines BL1-*BL1 to BL4-*BL4. When no block write signal BW is inputted, any one column decoder 7 is operated based on an address select signal outputted from the address buffer 9 to select any one pair out of the bit lines BL1-*BL1 to BL4-*BL4.

Operations are described hereinbelow. For block write operation, the pre-decoder 8 and write amplifier controller 4 receive the block write signal BW and the reset signal RS becomes Low level to turn the transistors Tr2 off. In this condition, the column decoders 7 are simultaneously operated to turn on the column select gates Tr1 to select simultaneously the bit lines BL1-*BL1 to BL4-*BL4. The write amplifiers $3_1$ to $3_4$ are simultaneously operated to write cell information on the four memory cells C selected by the word line WL.

For normal write operation, the pre-decoder 8 and write amplifier controller 4 do not receive the block write signal BW, and the reset signal RS becomes Low level to turn off the transistors Tr2. In this condition, any one of the column decoders 7 is operated based on the address signal outputted from the address buffer 9 to select any one of the bit lines BL1-*BL1 to BL4-*BL4. The write amplifiers $3_1$ to $3_4$ corresponding to the selected bit line are operated to write data on any one memory cell C out of the four memory cells C selected by the word line WL.

On the other hand, for a read operation, the pre-decoder 8 and write amplifier controller 4 do not receive the block write signal BW, and the reset signal RS becomes High level to turn the transistors Tr2 on. Thus, the data buses DB1-*DB1 to DB4-*DB4 are reset to a potential approximate to the source potential Vcc level. In this condition, any one address line WL is selected and any one of the column decoders 7 is operated based on the address signal outputted from the address buffer 9 to select any one of the bit lines BL1-*BL1 to BL4-*BL4. The cell information stored in the memory cell C connected to the addressed bit line out of the memory cells C selected by the word line WL is read through the addressed data bus to cause a potential difference between the data buses. Then, the addressed data bus is selected out of the data buses DB1-*DB1 to DB4-*DB4 by the selector 5, and the cell information read on the same data bus is read through the sense buffer 6.

In the conventional semiconductor memory device shown in FIG. 2, because the number of addresses to be simultaneously written is four in the block write operation, the number of columns is four, that is, four data buses are required. To provide simultaneous writing of eight columns; this system, it is required to increase the number of data buses from four pairs to eight pairs. For memory of the 2M- to 4M-bit class, because there are such data buses at the location of eight to sixteen or more, the data bus should be increased by 64 lines to 128 lines or more. Such increase results in increased occupied area.

This system has a structure that one column select line corresponds to one bit line pair in the figure. However, the wiring width of the column select line is required to be larger for actual manufacturing, and it is not practical that a column select line is provided for each bit line.

Further, regarding the number of redundant columns required for redundancy, because the column selected for block write operation is connected to the separate data buses respectively, the control of data bus selection for redundancy is very complex and results in reduced operational speed and increased chip size due to the increased control circuit. It is therefore required that the substitution is performed in the unit which is used for the block write operation by providing redundant columns equivalent to the number of columns of the block write.

As described above, in RAM having a conventional block write function with a column mask function, it is required to increase the number of data buses as the number of columns of the block write is increased, and the redundant columns equivalent to the number of columns of the block write should be prepared for one substitution when substituting redundancy. These requirements result in increased chip size.

BRIEF SUMMARY OF THE INVENTION

Objects of the Invention

Accordingly, it is an object of the present invention to provide a semiconductor memory device capable of writing simultaneously more bit line pairs for a block write operation without increased chip size.

Summary of the Invention

The semiconductor memory device of the present invention is provided with a first data line pair, second data line pair, a plurality of first bit line pairs respectively connected to the first data line pair through a plurality of first transfer gates, a plurality of second bit line pairs respectively connected to the second data line pair through a plurality of second transfer gates, a plurality of column select lines respectively connected commonly to a first transfer gate and a second transfer gate, and a decoder circuit, supplied with an input address and block write signal as the input, for activating simultaneously at least two column select lines regardless of the input address while the block write signal is activated and for activating the column select line corresponding to the input address while the block write signal is inactivated.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
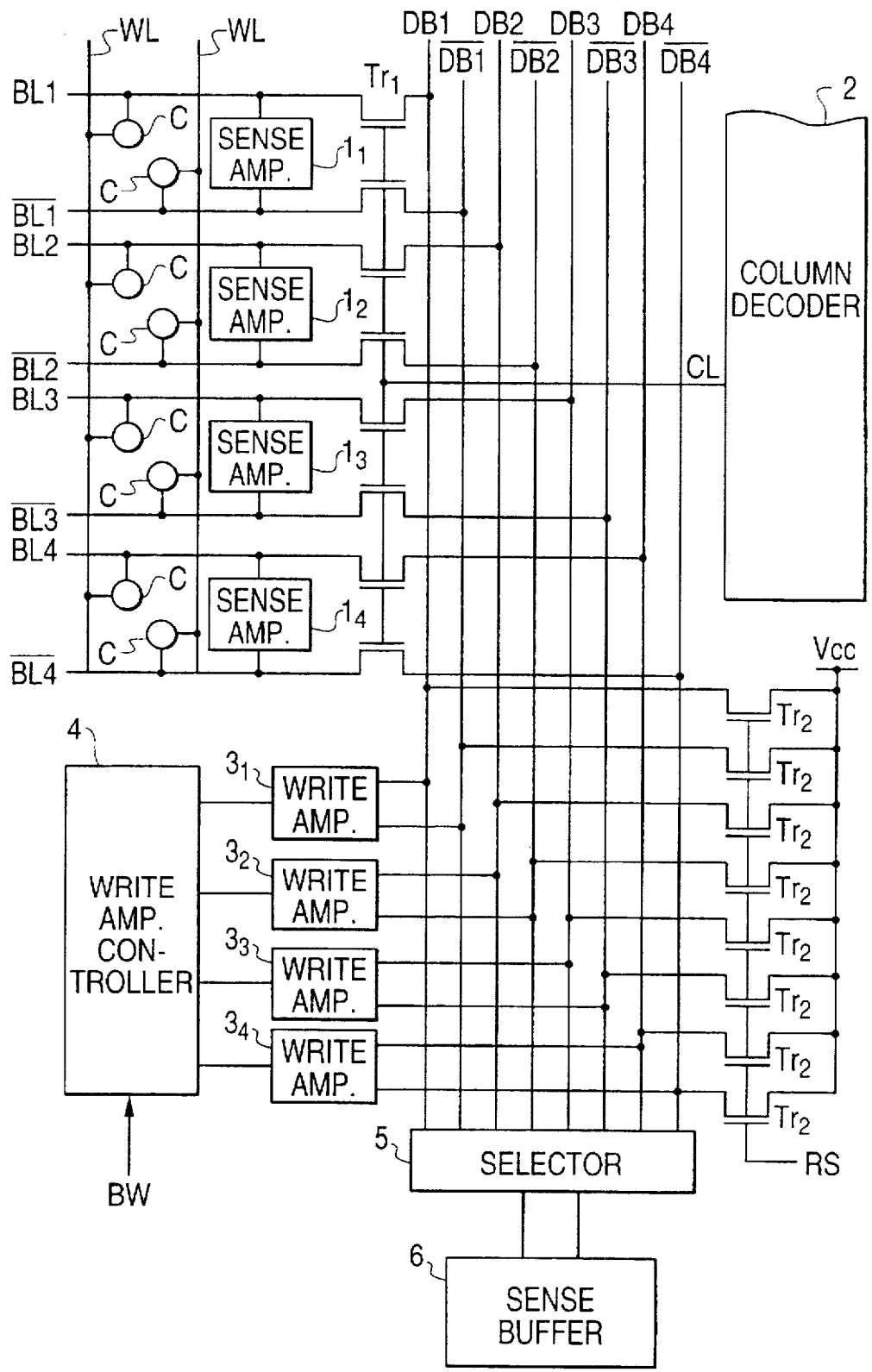
FIG. 1 is a circuit diagram for illustrating a semiconductor memory device having the conventional block write function.
Figure 2:
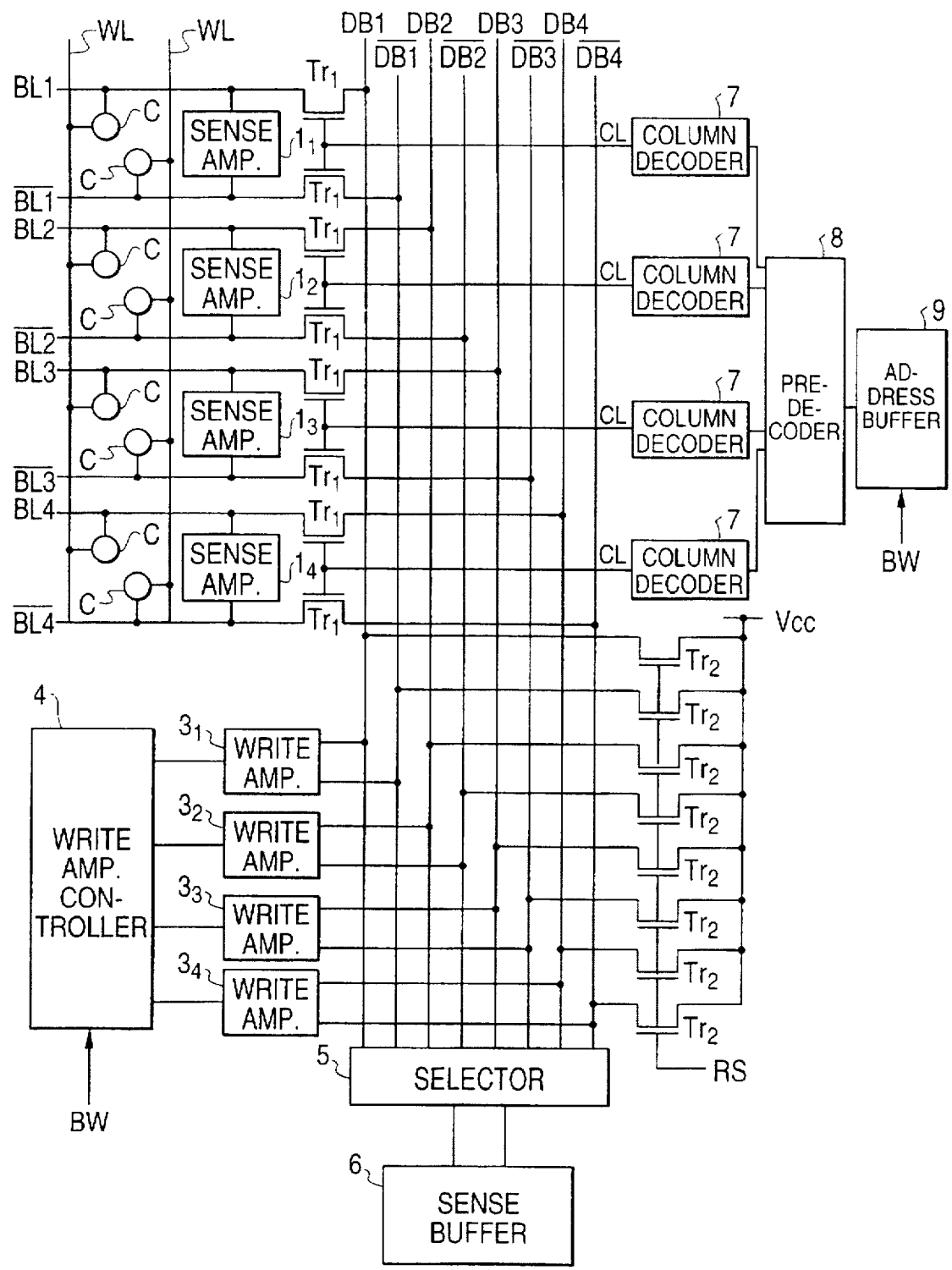
FIG. 2 is a circuit diagram for illustrating a semiconductor memory device having another conventional block write function.
Figure 3:
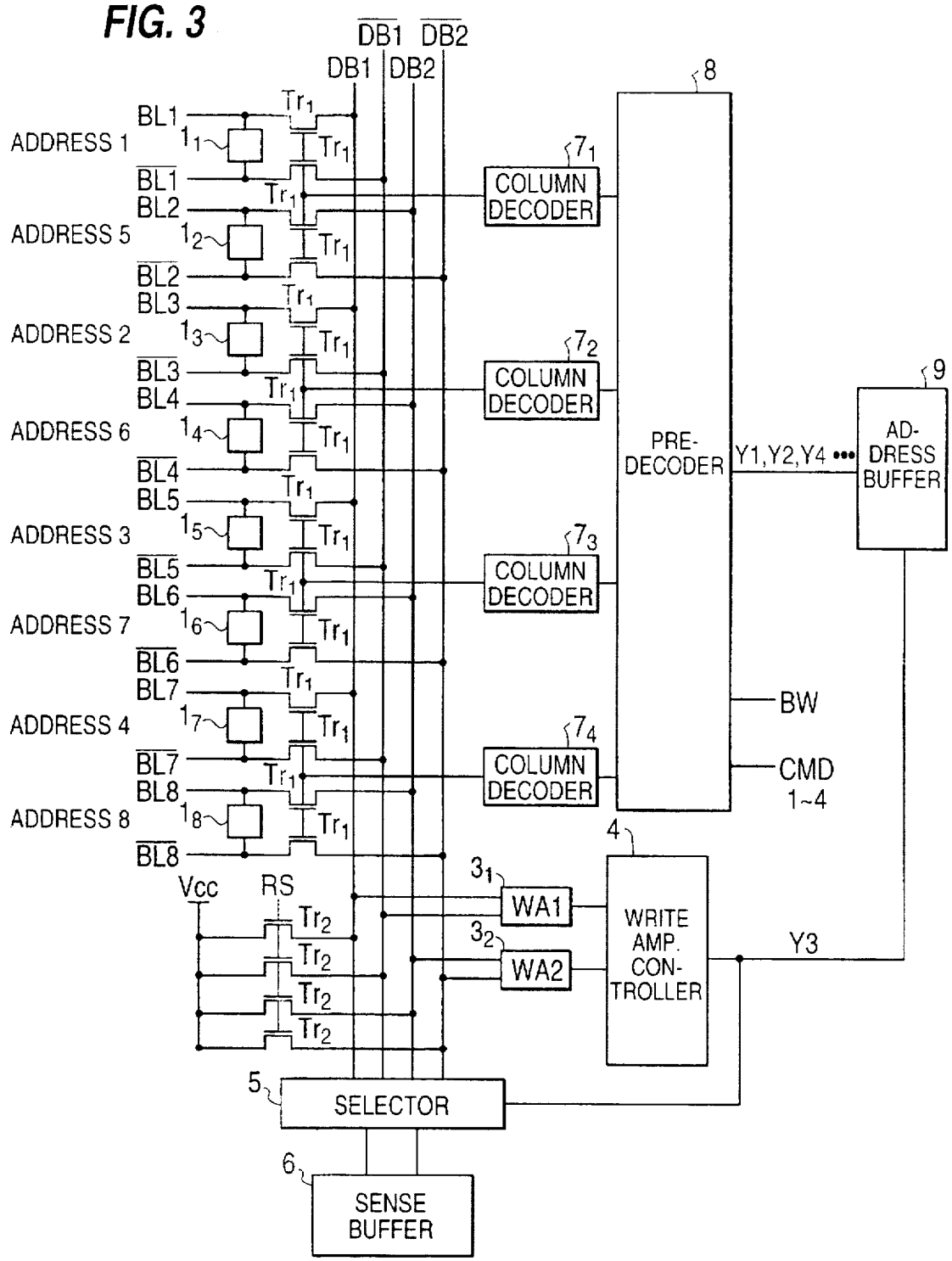
FIG. 3 is a circuit diagram for illustrating the first embodiment of the present invention.

The first embodiment of the present invention will be described referring to FIG. 3. In the FIG. 3, the same components as described in the conventional examples are given with the same reference characters and the detailed description is omitted.

In this embodiment, the number of block write columns is four like the conventional example. Sense amplifiers 1 to 14 are connected respectively to each pair of eight pairs of bit lines BL1-*BL1 to BL8-*BL8 which form one block. The bit lines BL1-*BL1 to BL8-*BL8 are selected respectively by column decoders $7_1$ to $7_4$ two pairs-by-two pairs and connected to respectively to data bus pairs DB1-*DB1 and DB2-*DB2 with interposition of column select gates Tr1.

Address bits Y1, Y2, Y4 . . . are inputted from an address buffer 9 to a pre-decoder 8. The address bit Y3 (third bit from LBB) is not inputted to the pre-decoder 8, i.e. is designated as "don't care." The pre-decoder 8 therefore judges the address (address one) for selecting BL1-*BL1 and the address (address five) for selecting BL2-*BL2 to be the same address, and the column decoder $7_1$ is selected.

In this embodiment, the bit line pairs are arranged so that two bit line pairs simultaneously selected are selected by one column decoder. For example, the bit lines are arranged in combinations such as BL1-*BL1 (address 1) and BL2-*BL2 (address five), BL3-*BL3 (address two) and BL4-*BL4 (address six).

In this embodiment, in which an address bit may be designated as don't care, if the address bit Y4 (fourth bit from LBB) is designated as don't care, then address one and address seven are the same address. There are eight column data in one group and eight bits of data are simultaneously written in a block write operation.

This embodiment is provided with a column mask function in addition to the block write function. The column mask function enables options to the clock write function, that is, the function enables selectively writing to any of addresses from among a plurality of addresses simultaneously selected. For example, the block write function with eight columns allows no writing at n desired n addresses ($n \leq 8$), and thus the function is capable of functioning for only selected addresses within the block.

Because of the column mask function, the pre-decoder 8 receives column mask signals CMD1 to CMD4 to activate only selected column decoders in response to these signals. For example, if CMD1 is Low level and other CMD2 to CMD4 are High level, only the column decoder 71 is inactivated.

The address bits Y1, Y2, and Y3 are ignored when the block write is performed, and the block write signal BW and column mask signals CMD1 to CMD4 are inputted. Column decoders corresponding to the level of the column mask signal CMD1 to CMD4 are simultaneously operated. In this embodiment, at most four column decoders are simultaneously operated, and eight column bit line pairs BL1-*BL1 to BL8-*BL8 are simultaneously selected.

In the condition that no block write signal BW is inputted to in the pre-decoder 8, the column mask signals CMD1 to CMD4 are ignored, and the column decoders 7 are operated based on the address bits Y1, Y2, and Y4 from the address buffer 9 to select two pairs out of the bit lines BL1-*BL1 to BL8-*BL8.

Write amplifiers (WA1 and WA2) $3_1$ and $3_2$ are respectively connected to and the data bus pairs DB1-*DB1 and DB2-*DB2, the write amplifiers $3_1$ and $3_2$ are operated based on a write control signal outputted from a write amplifier controller 4.

The write amplifier controller 4 is controlled by the address bit Y3 inputted from the address buffer 9, and only one write amplifier out of two write amplifiers is activated at a time regardless of block write operation.

Next, operations of this embodiment are described.

For block write operation, the block write signal BW is inputted to the pre-decoder 8 to operate at most eight column decoders based on the column mask signal CMD1 to CMD4, and at most eight columns are selected.

Then, the write amplifier controller 4 activates any one of the write amplifiers (WA1 and WA2) $3_1$ and $3_2$ based on the address bit Y3 outputted from the address buffer 9 to write data. When, bit line pairs corresponding to the addresses one to four are connected respectively to the data bus pair DB1-*DB1 and bit line pairs corresponding to the addresses five to eight are connected to the data bus pair DB2-*DB2, writing is therefore performed on any one bit line pair corresponding to the addresses one to four and any bit line pair corresponding to the addresses five to eight.

When column mask signals CMD1 to CMD4 are Low level columns corresponding to these signals are not written because the column decoder 7 is not operated.

On the other hand, for no block write operation, because the block write signal BW is not inputted to the pre-decoder 8, only one column decoder 7 is selected based on the address bits Y1, Y2, and Y4. The address bit Y3 to the write amplifier controller 4 activates one write amplifier $3_1$ or $3_2$ to result in writing on only one column.

According to this embodiment, the number of data buses can be reduced to two pairs, namely four lines, while four columns are is used for simultaneous writing.

For example, for a memory for eight bit input and output, if there are eight data bus locations, sixteen data buses can be eliminated. Further, for eight block write columns, the structure is formed so as to select simultaneously eight column decoders, and the write amplifier is selected by the write amplifier control circuit based on, for example, the address bit Y4 rather than the address bits Y1 to Y3. Therefore, thereby, it is not necessary to increase the number of data buses. On the other hand, 64 additional lines are required in the conventional system, and it means the reduction of 80 lines of data buses relatively.

The problem in manufacturing of bit lines and column select lines is solved and wiring is made possible by selection of one column for two columns.

Further, because redundancy is made possible only by substitution of the column decoder section, one substitution for one selection select line is possible. It is therefore sufficient to use the redundant column corresponding to the number of data buses, and it is not required to increase the number of redundant columns regardless of the increased number of columns.

In the above-mentioned embodiment, the address bit Y3 of one bit is used as a signal for controlling activation of the write amplifiers $3_1$ and $3_2$, however, the present invention is not limited to such structure, and the address signal may be composed of a plurality of bits.

Figure 4:
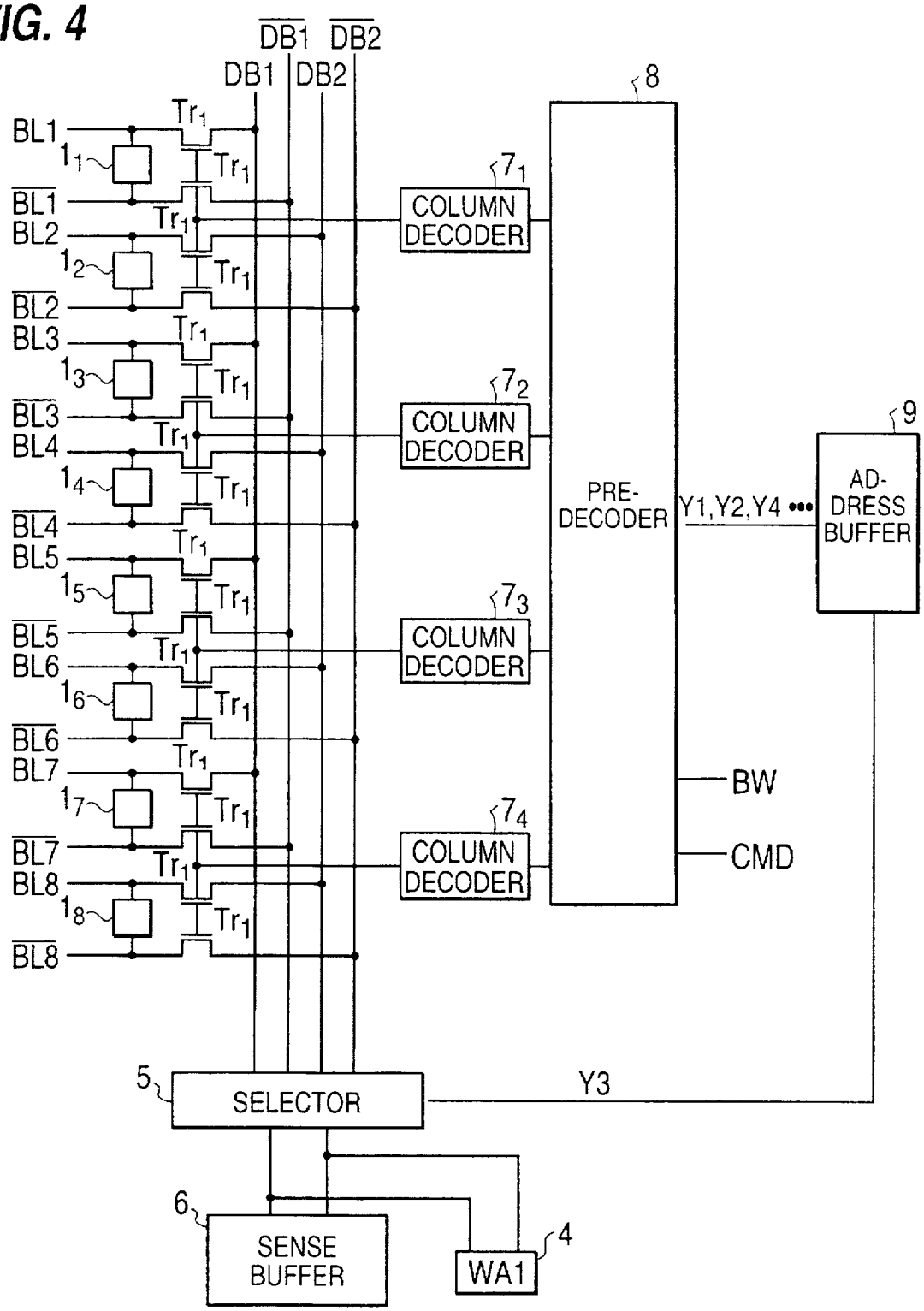
FIG. 4 is a circuit diagram for illustrating the second embodiment of the present invention.

The second embodiment is described referring to FIG. 4. The number of clock write columns is four as in the first embodiment. Because the basic structure is the same as that of the first embodiment, only different points will be described.

In this embodiment, the write amplifier corresponding to each data bus is not provided, the data bus is selected by the selector 5, and the write amplifiers 31 to 34 are provided to the signal line pairs after selection. As described hereinbefore, for data reading, the potential difference of the data bus selected by the selector is amplified by the sense buffer 6 and outputted to a subsequent circuit (not shown in the figure.)

The use of the address bit Y3 as the select control signal of the selector 5 allows the second embodiment to have the same function as the first embodiment.

In this embodiment, the common use of data bus select control for both reading and writing (common use of the address bit Y3 as select control signal for the selector 5) allows the control circuit to be simplified.

Although the invention has been described with reference to specific embodiments, this description is not meet to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:

a first data line;

a second data line;

a plurality of first bit lines respectively connected to said first data line through a plurality of first transfer gates;

a plurality of second bit lines respectively connected to a second data line through a plurality of second transfer gates;

a plurality of column select lines, each of said column select lines connected to a respective one of said first plurality of transfer gates and a respective one of said second plurality of transfer gates; an address buffer circuit for supplying all but prescribed bits of a supplied address as an input address; and a decoder circuit for simultaneously activating multiple column select lines corresponding to an input address when a block write signal is activated, and for activating a single column select line corresponding to said input address when said block write signal is not activated.

2. The semiconductor memory device as claimed in claim 1, further comprising a write control means for supplying a write data to any one of said first data line and said second data line upon receiving prescribed bits from said address buffer circuit.

3. A semiconductor memory device, comprising:

a first data line pair;

a second data line pair;

a plurality of first bit line pairs respectively connected to said first data line pair through a plurality of first transfer gates;

a plurality of second bit line pairs respectively connected to said second data line pair through a plurality of second transfer gates;

a plurality of column select lines, each of said column select lines connected to respective ones of said first plurality of transfer gates and said second -plurality of transfer gates; an address buffer circuit for supplying all but prescribed bits of a supplied address as an input address; and a decoder circuit for simultaneously activating multiple column select lines corresponding to said input address when a block write signal is activated, and for activating a single column select line corresponding to said input address when said block write signal is not activated.

4. The semiconductor memory device as claimed in claim 3, further comprising write control means for supplying a write data to any one of said first data line pair and said second data line pair upon receiving prescribed bits from said address buffer circuit.

* * * * *